United States Patent
Tsai

(10) Patent No.: US 9,257,584 B2
(45) Date of Patent: Feb. 9, 2016

(54) SOLAR CELL INTERCONNECTS AND METHOD OF FABRICATING SAME

(71) Applicant: TSMC Solar Ltd., Taichung (TW)

(72) Inventor: Chia-Hung Tsai, Kaohsiung (TW)

(73) Assignee: TSMC Solar Ltd., Taichung (TW)

( * ) Notice: Subject to any disclaimer, the term of this patent is extended or adjusted under 35 U.S.C. 154(b) by 0 days.

(21) Appl. No.: 14/210,497

(22) Filed: Mar. 14, 2014

(65) Prior Publication Data
US 2015/0263207 A1   Sep. 17, 2015

(51) Int. Cl.
*H01L 31/18* (2006.01)
*H01L 31/0465* (2014.01)

(52) U.S. Cl.
CPC ............ *H01L 31/0465* (2014.12); *H01L 31/18* (2013.01)

(58) Field of Classification Search
CPC .............................. H01L 31/18; H01L 31/0465
See application file for complete search history.

(56) References Cited

U.S. PATENT DOCUMENTS

| | | | | |
|---|---|---|---|---|
| 4,443,651 A * | 4/1984 | Swartz | .................. | H01L 31/046 136/244 |
| 8,546,171 B2 * | 10/2013 | Lee | .................... | B23K 26/0063 136/243 |
| 8,703,525 B2 * | 4/2014 | Park | ................ | H01L 31/022433 257/431 |
| 8,779,282 B2 * | 7/2014 | Kwon | ............. | H01L 31/022425 136/252 |
| 8,809,109 B2 * | 8/2014 | Dounas | ............... | H01L 31/0463 438/68 |
| 8,841,157 B2 * | 9/2014 | Rekow | ..................... | H01L 21/42 257/E31.124 |
| 8,884,154 B2 * | 11/2014 | Stangl | ................. | H01L 27/1423 136/244 |
| 9,041,141 B2 * | 5/2015 | Ahmed | .................... | C25D 5/10 257/459 |

* cited by examiner

*Primary Examiner* — Evan Pert
(74) *Attorney, Agent, or Firm* — Duane Morris LLP

(57) ABSTRACT

A solar cell device and a method of fabricating the device is described. The solar cell is fabricated by providing a substructure comprising an absorber over a back contact having a P1 line therein and scribing a P2 line in the absorber by mechanical scribing and laser scribing after the mechanical scribing. The scribing can be performed with an integrated scriber, including a scribing tip and a light source mounted adjacent the scribing tip and operable concurrently with the scribing tip.

20 Claims, 5 Drawing Sheets

SOLAR CELL INTERCONNECTS AND METHOD OF FABRICATING SAME

BACKGROUND

This disclosure relates to fabrication of photovoltaic solar cells.

Monolithic solar cell fabrication processes includes layering solar cell materials with an absorber material between front and back contacts and forming line patterns in the solar cell materials to isolate and connect the solar cells. The first line pattern (P1) is formed through the back contact material. The second line pattern (P2) is formed through the absorber material (and in some embodiments a buffer layer). The third line pattern (P3) is formed through the front contact and absorber materials (and the buffer layer, if present). However, patterning of the P1, P2 and P3 lines can damage and introduce impurities into the solar cell layers.

Such damage from patterning processes is a factor affecting solar cell performance. Due to the growing demand for clean sources of energy, various types of solar cell devices, tools and processes exist and continue to be developed in efforts to improve the performance of solar cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a schematic cross section of a solar cell, in accordance with some embodiments.

DETAILED DESCRIPTION

Figure 2:
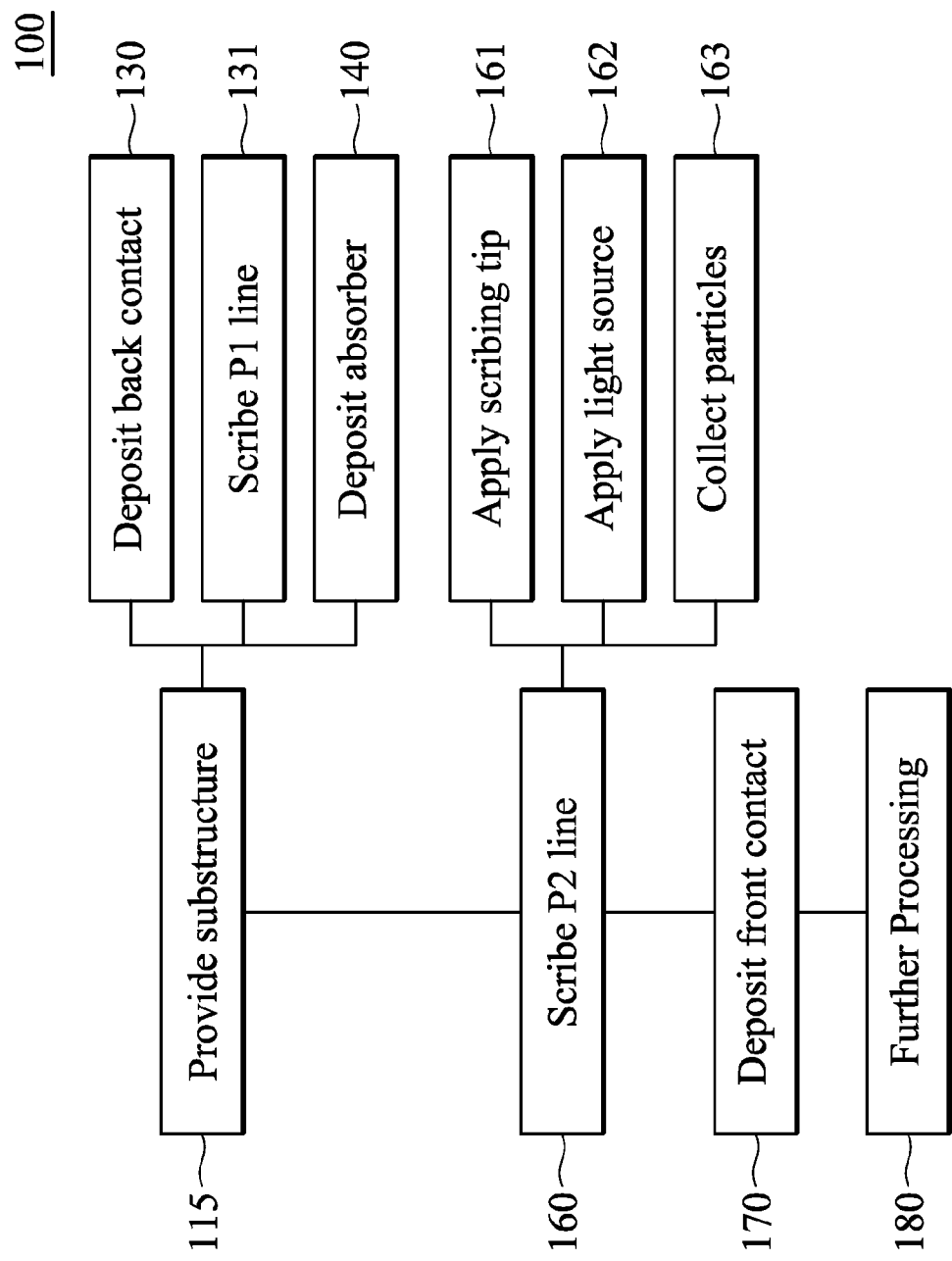
FIG. 2 is a flow chart of a method of fabricating a solar cell, in accordance with some embodiments.

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
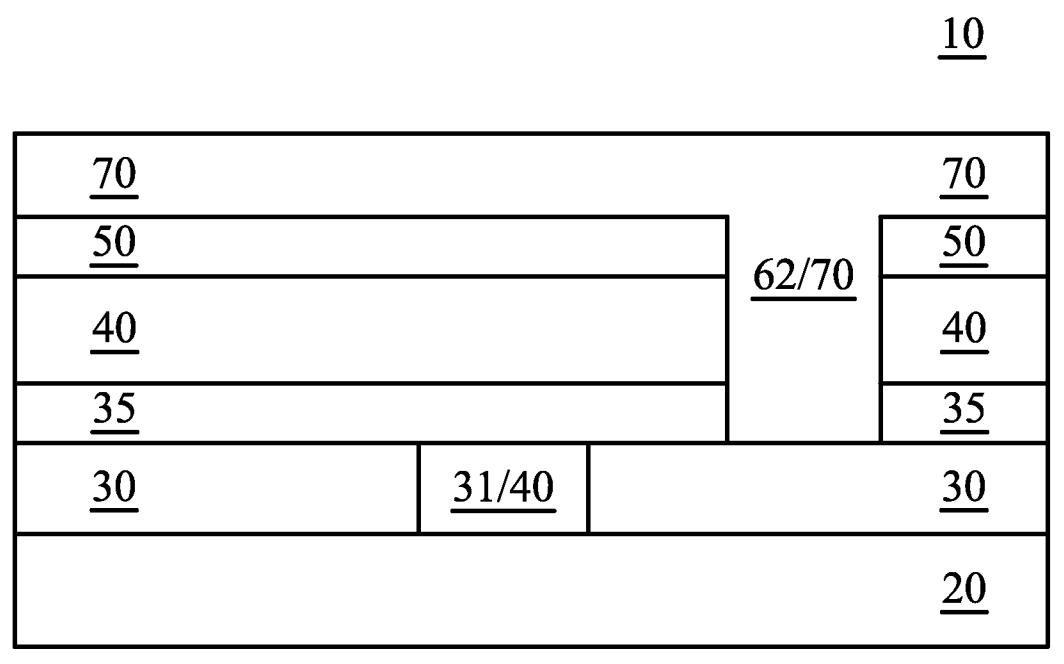

FIG. 1 shows a cross section of a solar cell 10 according to some embodiments. The solar cell includes a substrate 20, a back contact 30 over the substrate 20, and an absorber 40 over the back contact 30. In some embodiments, the solar cell includes an interface layer 35 between the back contact 30 and the absorber 40. In other embodiments, the back contact 30 is formed directly on the substrate. In some embodiments, the solar cell includes a P1 line 31 through the back contact 30. In some embodiments having the back contact 30 formed directly on the substrate 20, the P1 scribe line is filled with the absorber material as shown in FIG. 1. The solar cell also includes a P2 line 62 extending through the absorber 40 and, in some embodiments as shown in FIG. 1, extending through a buffer layer 50 and the interface layer 35. Further details of the solar cell 10, the method and solar cell 10 and substructures 15 formed according to the methods are provided in conjunction with the accompanying figures.

FIG. 2 shows a flowchart describing a broad method 100 for fabricating a solar cell. At step 115, a solar cell substructure 15 is provided. In some embodiments, the substructure 15 includes the substrate 20, back contact 30 and absorber 40. In some embodiments, the step 115 of providing the substructure 15 can include substeps 130-140. At substep 130, the back contact 30 can be deposited over the substrate 20.

The substrate 20 includes any suitable substrate material. In some embodiments, the substrate 20 can include glass (e.g., soda lime glass or sodium-free (high strain point) glass), flexible metal foil (e.g., stainless foil), a polymer (e.g., polyimide, polyethylene terephthalate (PET), polyethylene naphthalene (PEN)), or other substrate materials. The back contact layer 30 includes any suitable conductive material, such as metals, for forming an electrical contact and assisting in light trapping and photo-current extraction in the solar cell. In some embodiments, the back contact layer 30 can include molybdenum (Mo), platinum (Pt), gold (Au), silver (Ag), nickel (Ni), or copper (Cu). The back contact 30 can be deposited by physical vapor deposition (PVD), for example sputtering of a metal such as Mo, Cu or Ni over the substrate 20, or by chemical vapor deposition (CVD), atomic layer deposition (ALD), or other suitable techniques.

At substep 131, the P1 line 31 can be scribed through the back contact 30. In some embodiments, the P1 line 31 extends through the entire thickness of the back contact 30. The P1 line 31 can be scribed by laser scribing, mechanical scribing, photolithography, or other suitable techniques.

At substep 140, the absorber 40 can be deposited over the back contact 30 at substep 140. The absorber 40 can also fill some or all of the P1 line 31 scribed therein. The absorber 40 includes any suitable absorber material, such as p-type semiconductors, for absorbing light for conversion into electrical current. In some embodiments, the absorber 40 includes amorphous silicon (α-Si), cadmium telluride (CdTe), or chalcopyrite-based materials such as $Cu(In,Ga)Se_2$ (CIGS), $CuInSe_2$ (CIS), $CuGaSe_2$ (CGS), $Cu(In,Ga)(Se,S)_2$ (CIGSS). The absorber 40 can be deposited over the back contact 30 by PVD (e.g., sputtering), CVD, electrodeposition, combinations thereof, or other suitable techniques. For example, a CIGS absorber 40 can be formed by depositing metal precursors for copper, indium and gallium, followed by a selenization process including introducing selenium or selenium-containing chemicals in a gas state into the metal layers. In some embodiments, the selenium is introduced by evaporation. In a CIGSS absorber 40, the process can also include a sulfurization process, introducing sulfur or sulfur-containing chemicals in a gas state to the CIGS layer.

In some embodiments, the substructure 15 also includes the interface layer 35 formed over the back contact 30 as shown in FIGS. 1 and 4A-C. In some embodiments, the interface layer 35 can have a thickness of about 5 nm or more, 10 nm or more, 50 nm or more, 100 nm or more, 125 nm or more, 150 nm or more, 200 nm or more, and 250 nm or more. In other embodiments, the interface layer 35 can have a thickness of about 500 nm or less, 450 nm or less, 400 nm or less, 350 nm or less, 300 nm or less, 275 nm or less, 200 nm or less, and 100 nm or less. In other embodiments, the thickness can range between a combination of the foregoing. For example, ranging from about 5 nm to 500 nm, 5 nm to 300 nm, 50 nm to 300 nm, and 100 nm to 300 nm.

The interface layer 35 can be formed during or/or as a result of the deposition of the absorber 40 over the back contact 30. For example, absorber materials may react with the back contact material during certain processes, such as selenization or sulfurization after selenization processes. In some embodiments, the back contact material is selected based on the type of absorber material. For example, the back contact 30 can be Mo for a CIGS or CIGSS absorber 40. During deposition of the CIGS or CIGSS absorber over the Mo back contact 30, an interface layer 35 comprising $MoSe_2$ or $Mo(SeS)_x$ (e.g., $MoSeS_2$) can be formed between the back contact 30 and absorber 40.

In some embodiments, the substructure 15 also includes a buffer layer 50 deposited over the absorber 40 as shown in FIGS. 1 and 4A-C. The buffer layer 50 includes any suitable buffer material, such as n-type semiconductors, for improving the interface between the absorber 40 and a front contact 70 and protecting the absorber 40 during further processing. In some embodiments, buffer layer 50 can include cadmium sulfide (CdS), zinc sulphide (ZnS), zinc selenide (ZnSe), indium(III) sulfide ($In_2S_3$), indium selenide ($In_2Se_3$), $Zn_{1-x}Mg_xO$, (e.g., ZnO), or other suitable buffer materials. The buffer layer 50 can be deposited by chemical deposition (e.g., CVD, chemical bath deposition), PVD, ALD, or other suitable techniques.

As shown in FIG. 2, the P2 line 62 is scribed in the substructure 15 at step 160. The P2 line 62 provides a channel to electrically connect a front contact 70 with the back contact 30 of the next adjacent solar cell, providing a series interconnection between adjacent solar cells within a solar cell module (not shown). In some embodiments, step 160 includes substeps 161 and 162. At substep 161, a scribing tip 225 can be applied to the substructure 15. At substep 162, a light source 255 (e.g., a laser) can be applied to the same area or a portion of the area of the substructure 15. As further described below, substeps 161 and 162 can be performed concurrently and/or substep 162 can be performed immediately after substep 161.

Figure 3:
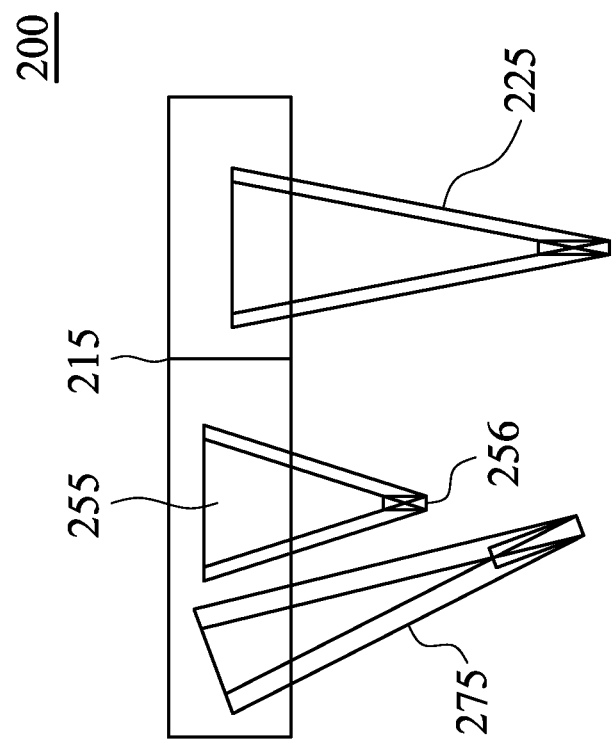
FIG. 3 is a schematic side view of an integrated scriber, in accordance with some embodiments.

In some embodiments, the P2 line 62 is scribed with an integrated scriber 200. As shown in FIG. 3, the integrated scriber 200 includes the scribing tip 225 and the light source 255 mounted adjacent the scribing tip 225. For example, the light source 255 can be mounted on the scribing tip 225, or the light source 255 and scribing tip 225 can be mounted proximate one another on a base 215. In some embodiments, the base 215 can be moveable, such that the scribing tip 225 and light source 255 move as a unit.

Figures 4A, 4B:
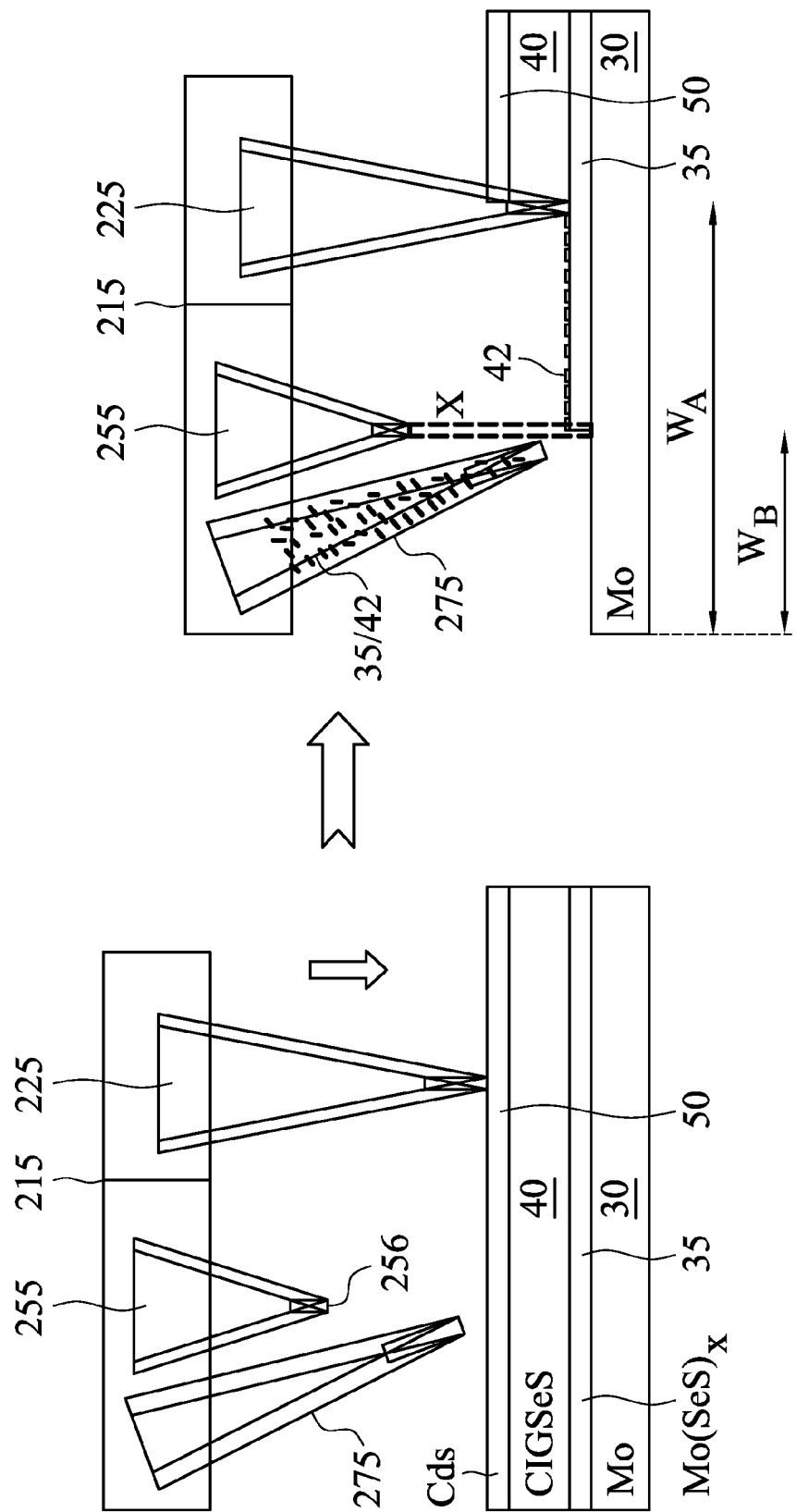
FIG. 4A is a schematic cross section of a solar cell substructure before P2 line scribing, in accordance with some embodiments.
FIG. 4B is a schematic cross section of a solar cell substructure during P2 scribing, in accordance with some embodiments.
Figure 4C:
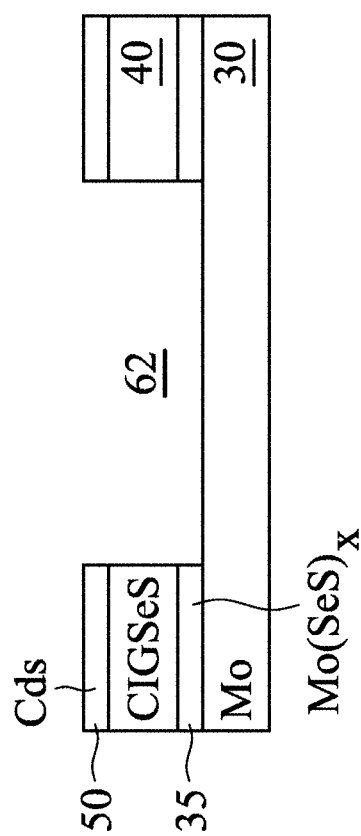
FIG. 4C is a schematic cross section of a solar cell substructure after P2 line completion, in accordance with some embodiments.

In some embodiments as shown in FIGS. 4A through 4C, the step of scribing the P2 line can include contacting the scribing tip 225 with the solar cell substructure 15 as shown in FIG. 4A. The scribing tip 225 can include a suitable material for cutting the absorber material. For example, the scribing tip 225 can include diamond or the like.

As shown in FIG. 4B, the scribing tip 225 can be moved along an area of the substructure 14, cutting a trench having a width (shown as $W_A$ in FIG. 4B) in the absorber 40 and (in embodiments including a buffer layer 50) also through the buffer layer 50. In some instances, the scribing tip 225 can leave an absorber residue 42 at the bottom of the trench. The light source 255 on the integrated scriber 200 follows the movement of and, in some embodiments, moves concurrently with, the scribing tip 225. That is, the X and Y displacements between the light source 255 and the scribing tip 225 are maintained while they are both moved relative to the substrate. The light source 255 can includes a light emitting end 256 through which a light beam X can be emitted. In some embodiments, the emitting end 256 faces the same direction as the scribing tip 225 (e.g. towards the trench); and the light source 255 focuses the beam X on the residue 42 within the trench. In embodiments including the interface layer 35, the beam X can also reach the interface layer 35 as shown in FIG. 4B.

The light source 255 can generate a beam X configured to remove or assist in removing the residue 42 and/or the portion of the interface layer 35 within the trench. In some embodiments, the light source 255 can be a laser configured to generate a beam X having a wavelength of about 800 nm or more, 850 nm or more, 900 nm or more, 950 nm or more, 1000 nm or more, 1100 nm or more, 1150 nm or more, 1200 nm or more, and 1300 nm or more. In other embodiments, the wavelength can be about 1300 nm or less, 1250 nm or less, 1200 nm or less, 1150 nm or less, 1000 nm or less, and 950 nm or less. In other embodiments, the wavelength can range between a combination of the foregoing. For example, ranging from about 800 nm to 1250 nm, 800 nm to 950 nm, and 1100 nm to 1250 nm.

In some embodiments, the light source 255 generates a beam X having a pulse cycle time of about 50 picosecond (ps) or less, 40 ps or less, 40 ps or less, 25 ps or less, 15 ps or less, 10 ps or less, and 5 ps or less. In other embodiments, pulse cycle time can be about 5 ps or more, 10 ps or more, 15 ps or more, 20 ps or more, 30 ps or more, and 45 ps or more. In other embodiments, the pulse cycle time can range between a combination of the foregoing. For example, ranging from about 5 ps to 50 ps, 10 ps to 50 ps, 15 ps to 40 ps, and 20 ps to 30 ps. In some embodiments, the light source 255 can include a duty cycle of about 0.1 or more, 0.2 or more, and 0.5 or more. In other embodiments, the duty cycle can be about 0.9 or less, 0.8 or less, 0.6 or less, and 0.5 or less. In other embodiments, the duty cycle for the light source 255 can range between a combination of the foregoing. For example, ranging from about 0.1 to 0.9.

In some embodiments, the light source 255 generates a beam X having a power of about 0.1 Watt (W) or more, 0.2 W or more, 0.5 W or more, 1 W or more, 2 W or more, and 3.5 W or more. In other embodiments, the power can be about 5 W or less, 4.5 W or less, 4 W or less, 3 W or less 1.5 W or less, and 1 W or less. In other embodiments, the power can range between a combination of the foregoing. For example, ranging from about 0.1 W to 5 W, 1 W to 5 W, and 0.5 to 3 W. The light source 255 parameters can be further adjusted based on the characteristics of the residue 42 or interface layer 35, e.g. thickness and area, for the application.

The light source 255 beam X can be applied to the entire width $W_A$ of the trench, or the light source 255 beam X can cover only a portion of the trench. In some embodiments, a width (shown as $W_B$ in FIG. 4B) covered by the beam X includes 50% or more of the width $W_A$ covered by the scribing tip 225, 60% or more, 70% or more, 75% or more, 80% or more, and 90% or more. In other embodiments, the $W_B$ is 100% or less of $W_A$, 95% or less, 93% or less, 90% or less, 80% or less, and 75% or less. In other embodiments, the beam to scriber top coverage ratio (i.e., $W_B/W_A$) can range between a combination of the foregoing. For example, ranging from about 50% to 95%, 75% to 95% and 60% to 80%.

In some embodiments, a horizontal distance between the light emitting end 256 and scribe tip 225 center can be about 0.1 mm or more, 0.2 mm or more, 0.5 mm or more 1 mm or more, 1.5 mm or more, 2 mm or more, 2.5 mm or more, and 3 mm or more. In other embodiments, the horizontal distance can be about 5 mm or less, 4.8 mm or less, 4.5 mm or less, 4.3 mm or less, 4 mm or less, 3.5 mm or less, 3 mm or less, 2.5 mm or less, 2 mm or less, and 1 mm or less. In other embodiments, the horizontal distance between the light emitting end 256 and scribe tip 225 center can range between a combination of the foregoing. For example, ranging from about 0.1 to 5 mm, 0.1 to 1 mm, 0.5 to 2.5 mm, and 1 to 4 mm.

In some embodiments, a vertical distance between light emitting end 256 and the buffer layer 50 (e.g., CdS film) can be about 0.1 mm or more, 0.2 mm or more, 0.5 mm or more 1 mm or more, 1.5 mm or more, 2 mm or more, 2.5 mm or more, and 3 mm or more. In other embodiments, the vertical distance can be about 5 mm or less, 4.8 mm or less, 4.5 mm or less, 4.3 mm or less, 4 mm or less, 3.5 mm or less, 3 mm or less, 2.5 mm or less, 2 mm or less, and 1 mm or less. In other embodiments, the vertical distance between light emitting end 256 and the buffer layer 50 or absorber 40 can range between a combination of the foregoing. For example, ranging from about 0.1 to 5 mm, 0.1 to 4 mm, 0.2 to 2 mm, and 0.5 to 1.5 mm.

In some embodiments, scribing the P2 line at step 160 also includes a substep 163 as shown in FIG. 2 for collecting particles from the trench. Substep 163 can be performed concurrently with and/or immediately after substeps 161 and 162. In some embodiments, the integrated scriber 200 also includes a particle collector 275 mounted adjacent the light source 255 as shown in FIG. 4B. The particle collector 275 can include a suitable apparatus for removing or assisting in removing particles of residue 42 and/or interface layer 35 from the trench. For example, the particle collector 275 can include an absorption pump or the like.

The particle collector 275 follows the movement of the light source 255 and/or the scribing tip 225. In some embodiments, the particle collector 275 moves concurrently with the light source 255 and/or the scribing tip 225. For example, the collector 275 can be mounted on the light source 255 or adjacent the light source 255 or scribing tip 225. In some embodiments as shown in FIG. 4B, collector 275 can be mounted on the moveable base 215 with the light source 255 and scribing tip 225 and face the same direction (e.g. towards the trench). In some embodiments, the particle collector 275 is mounted proximate a side of the light source 255 opposite the side of the light source 255 that is proximate the scribing tip 225.

FIG. 4C shows the P2 scribe line after particle collection. All of the interface layer material 35 has been removed, providing a clean, residue-free back contact 30 surface prior to front contact 70 deposition.

As shown in FIG. 2, a front contact 70 can be deposited over the absorber 40 at step 170. The front contact 70 can also fill or substantially fill the P2 line 62. The front contact 70 includes suitable front contact materials, such as metal oxides (e.g. indium oxide). In some embodiments, the front contact 70 includes transparent conductive oxides such as indium tin oxide (ITO), fluorine-doped tin oxide (FTO), aluminum-doped zinc oxide (AZO), gallium doped ZnO (GZO), alumina and gallium co-doped ZnO (AGZO), boron-doped ZnO (BZO), and combinations thereof.

In some embodiments at step 180, the solar cell can undergo additional processing operations to complete the device and connect the device to other solar cells devices to form solar modules and solar arrays. For example, further processing may include scribing P3 lines, edge deletion, bus bar bonding, lamination and I-V testing.

Although particular examples of solar cells are described above, the structures and methods described herein can be applied to a broad variety of solar cells, including CIGS, CIS, CGS, CIGSS, α-Si, and CdTe with pn junction, p-i-n stricture, MIS structure, multi-junction, or the like.

The solar cells, solar cell substructures and methods according to the disclosure provide improved solar cell performance. In particular, the method provides for a cleaner P2 scribe line and a device with a significantly improved interface between the front and back contacts and higher photovoltaic conversion efficiency. Additionally, the methods and devices also effectively reduce the series resistance ($R_S$) for the devices, because absorber material (having a lower resistivity than the interface layer material) in the P2 line can directly contact the back contact 30 of the next adjacent solar cell. Furthermore, the efficient and effective methods can be easily implemented in existing and new solar cell fabrication processes. For example, the methods are easy to integrate with current CIGSS production lines. As such, the disclosed methods can provide significantly improved devices at a low additional cost.

In some embodiments, a method of fabricating a solar cell includes: providing a substructure having an absorber over a back contact having a P1 line therein; and scribing a P2 line through the absorber by mechanical scribing and laser scribing after mechanical scribing.

In some embodiments, providing the substructure includes providing a substrate, depositing the back contact over the substrate, scribing the P1 line through the back contact, and depositing the absorber over the back contact and within the P1 line.

In some embodiments, the scribing the P2 line includes moving a scribing tip along an area of the substructure to cut a trench, with a light source following the scribing tip, and focusing a beam from the light source on residue within the trench.

In some embodiments, a width covered by the beam includes at least 50% of a width covered by the scribing tip.

In some embodiments, a width covered by the beam includes about 50% to 95% of a width covered by the scribing tip.

In some embodiments, the substructure includes an interface layer between the back contact and the absorber, and the scribing step also scribes the P2 line through the interface layer.

In some embodiments, scribing the P2 line includes moving a scribing tip along an area of the substructure to cut a trench, wherein a light source follows the scribing tip, and focusing a beam from the light source on a portion of the interface layer within the trench.

In some embodiments, the scribing step is performed with an integrated scriber including a scribing tip and a light source mounted adjacent the scribing tip and operable concurrently with the scribing tip.

In some embodiments, the scribing step further comprises collecting particles from the P2 line.

In some embodiments, the scribing step includes moving a scribing tip along an area of the substructure to cut a trench, with a light source following the scribing tip and a particle collector following the light source; focusing a beam from the light source on residue within the trench; and removing particles from the trench with the particle collector.

In some embodiments, a solar cell includes a substrate, a back contact over the substrate and having a P1 line therein, an absorber over the back contact, an interface layer between the back contact and the absorber, and a P2 line extending through the absorber and the interface layer.

In some embodiments, the solar cell also includes a front contact over the absorber, and the front contact directly connects with the back contact in the P2 line.

In some embodiments, the interface layer includes $Mo(SeS)_x$.

In some embodiments, the solar cell also includes a buffer layer over the absorber and the P2 line extends through the buffer layer.

In some embodiments, an integrated scriber includes a moveable base, a scribing tip mounted on the base, and a light source mounted adjacent the scribing tip on the base and having a light emitting end. The light source and scribing tip are operable concurrently.

In some embodiments, the light emitting end of the light source faces in the same direction as the scribing tip.

In some embodiments, the light source generates a beam having a wavelength ranging from about 1100 nm to about 1250 nm.

In some embodiments, the light source generates a beam having a pulse ranging from about 10 ps to about 50 ps.

In some embodiments, the light source generates a beam having a power ranging from about 0.1 W to about 5 W.

In some embodiments, the integrated scriber also includes a particle collector mounted adjacent the light source on the base.

In some embodiments, the light source is mounted between the scribing tip and the particle collector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a solar cell comprising:
    providing a substructure comprising an absorber over a back contact having a P1 line therein; and
    scribing a P2 line through said absorber by:
        mechanical scribing; and
        laser scribing after said mechanical scribing.

2. The method as in claim 1, wherein said providing step comprises:
    providing a substrate;
    depositing said back contact over said substrate;
    scribing said P1 line through said back contact; and
    depositing said absorber over said back contact and within said P1 line.

3. The method as in claim 1, wherein said scribing step comprises:
    moving a scribing tip along an area of said substructure to cut a trench, wherein a light source follows said scribing tip; and
    focusing a beam from said light source on residue within said trench.

4. The method as in claim 3, wherein a width covered by said beam comprises at least 50% of a width covered by said scribing tip.

5. The method as in claim 3, wherein a width covered by said beam comprises about 50% to 95% of a width covered by said scribing tip.

6. The method as in claim 1, wherein said substructure further comprises an interface layer between said back contact and said absorber; and said scribing step further scribes said P2 line through said interface layer.

7. The method as in claim 6, wherein said scribing step comprises:
    moving a scribing tip along an area of said substructure to cut a trench, wherein a light source follows said scribing tip; and
    focusing a beam from said light source on a portion of said interface layer within said trench.

8. The method as in claim 1, wherein said scribing step is performed with an integrated scriber comprising:
    a scribing tip; and
    a light source mounted adjacent said scribing tip and operable concurrently with said scribing tip.

9. The method as in claim 1, wherein said scribing step further comprises collecting particles from said P2 line.

10. The method as in claim 9, wherein said scribing step comprises:
    moving a scribing tip along an area of said substructure to cut a trench, wherein a light source follows said scribing tip and a particle collector follows said light source;
    focusing a beam from said light source on residue within said trench; and
    removing particles from said trench with said particle collector.

11. A method of fabricating a solar cell comprising:
    providing a substructure comprising an absorber over a back contact having a P1 line therein;
    scribing a P2 line through said absorber by:
        mechanical scribing to cut a trench in the substructure and
        laser scribing within the trench after said mechanical scribing; and
    depositing a front contact over the absorber and within the trench, wherein the front contact directly connects with the back contact in the P2 line.

12. The method as in claim 11, wherein said scribing step further comprises removing absorber residue from within the trench.

13. The method as in claim 11, wherein said scribing step further comprises removing an interface layer from within the trench.

14. The method as in claim 11, wherein said substructure further comprises an interface layer between the back contact and absorber and said P2 line is scribed though the interface layer.

15. The method as in claim 14, wherein said interface layer comprises $Mo(SeS)_x$.

16. A method of fabricating a solar cell comprising:
   providing a substructure comprising an absorber over a back contact having a P1 line therein; and
   scribing a P2 line through said absorber by:
      mechanical scribing with a scribing tip; and
      laser scribing with a light source after said mechanical scribing, wherein said scribing tip and light source are mounted on a movable base.

17. The method as in claim 16, wherein said scribing tip and light source are applied to the substructure concurrently.

18. The method as in claim 16, wherein a beam is applied from said light source having a wavelength ranging from about 1100 nm to about 1250 nm.

19. The method as in claim 16, wherein a beam is applied from said light source having a power ranging from about 0.1 W to about 5 W.

20. The method as in claim 16, wherein said movable base further comprises a particle collector mounted adjacent said light source; and the scribing step further comprises removing absorber residue with the particle collector.

\* \* \* \* \*